(12) United States Patent
Shiina

(10) Patent No.: US 11,815,773 B2
(45) Date of Patent: Nov. 14, 2023

(54) DISPLAY DEVICE

(71) Applicant: Japan Display Inc., Tokyo (JP)

(72) Inventor: Hideki Shiina, Tokyo (JP)

(73) Assignee: Japan Display Inc., Tokyo (JP)

(*) Notice: Subject to any disclaimer, the term of this patent is extended or adjusted under 35 U.S.C. 154(b) by 511 days.

(21) Appl. No.: 17/181,278

(22) Filed: Feb. 22, 2021

(65) Prior Publication Data

US 2021/0173274 A1 Jun. 10, 2021

Related U.S. Application Data

(63) Continuation of application No. PCT/JP2019/032776, filed on Aug. 22, 2019.

(30) Foreign Application Priority Data

Aug. 23, 2018 (JP) .................................. 2018-156198

(51) Int. Cl.
  *G02F 1/1362* (2006.01)
  *G02F 1/1368* (2006.01)
  *H01L 27/12* (2006.01)

(52) U.S. Cl.
  CPC ...... *G02F 1/136286* (2013.01); *G02F 1/1368* (2013.01); *G02F 1/136209* (2013.01); *G02F 1/136222* (2021.01); *H01L 27/1244* (2013.01)

(58) Field of Classification Search
  CPC .................................................... H01L 27/12
  See application file for complete search history.

(56) References Cited

U.S. PATENT DOCUMENTS

| | | | | |
|---|---|---|---|---|
| 10,559,604 | B2* | 2/2020 | Zhan | ...................... H01L 27/124 |
| 2002/0033922 | A1* | 3/2002 | Hidehira | ........... G02F 1/134363 |
| | | | | 349/141 |
| 2006/0262253 | A1 | 11/2006 | Teramoto et al. | |
| 2009/0051636 | A1 | 2/2009 | Natori | |
| 2010/0026611 | A1 | 2/2010 | Igeta et al. | |
| | | (Continued) | | |

FOREIGN PATENT DOCUMENTS

| | | |
|---|---|---|
| JP | H08-213631 A | 8/1996 |
| JP | 2006-343728 A | 12/2006 |
| | (Continued) | |

OTHER PUBLICATIONS

English translation of the International Search Report dated Nov. 19, 2019 for the PCT application No. PCT/JP2019/032776.

*Primary Examiner* — William A Harriston
(74) *Attorney, Agent, or Firm* — Michael Best & Friedrich LLP

(57) ABSTRACT

A display device has a frame region in a displaying region. The frame region includes a first scan line, and a first signal line and a second signal line adjacent to each other. The first signal line has a first wide section, and the first signal line intersects the first scan line at the first wide section in plan view. The first scan line has a second wide section. The second signal line has a pair of third wide sections, and the second signal line intersects the second wide section of the first scan line at the pair of third wide sections in plan view. The first wide section of the first signal line is opposite to the second signal line between the pair of third wide sections without being opposite to the pair of third wide sections.

7 Claims, 12 Drawing Sheets

(56) References Cited

U.S. PATENT DOCUMENTS

| | | | |
|---|---|---|---|
| 2010/0053058 A1* | 3/2010 | Nagashima | G09G 3/36 |
| | | | 345/98 |
| 2010/0060842 A1* | 3/2010 | Igeta | G02F 1/13394 |
| | | | 349/155 |
| 2013/0235279 A1 | 9/2013 | Sugisaka | |
| 2016/0019856 A1 | 1/2016 | Tanaka et al. | |
| 2016/0202515 A1 | 7/2016 | Watanabe et al. | |
| 2017/0123452 A1 | 5/2017 | Evans, V et al. | |
| 2017/0154566 A1* | 6/2017 | Ryoo | G09G 3/3648 |
| 2017/0162111 A1* | 6/2017 | Kang | H10K 50/844 |
| 2017/0294502 A1 | 10/2017 | Ka et al. | |

FOREIGN PATENT DOCUMENTS

| | | |
|---|---|---|
| JP | 2009-047902 A | 3/2009 |
| JP | 2010-032760 A | 2/2010 |
| JP | 2010-054871 A | 3/2010 |
| JP | 2010-066461 A | 3/2010 |
| KR | 10-2008-0046808 A | 5/2008 |
| KR | 10-2017-0070601 A | 6/2017 |
| WO | 2012/070498 A1 | 5/2012 |
| WO | 2014/142183 A1 | 9/2014 |
| WO | 2015/029704 A1 | 3/2015 |

* cited by examiner

F I G. 4
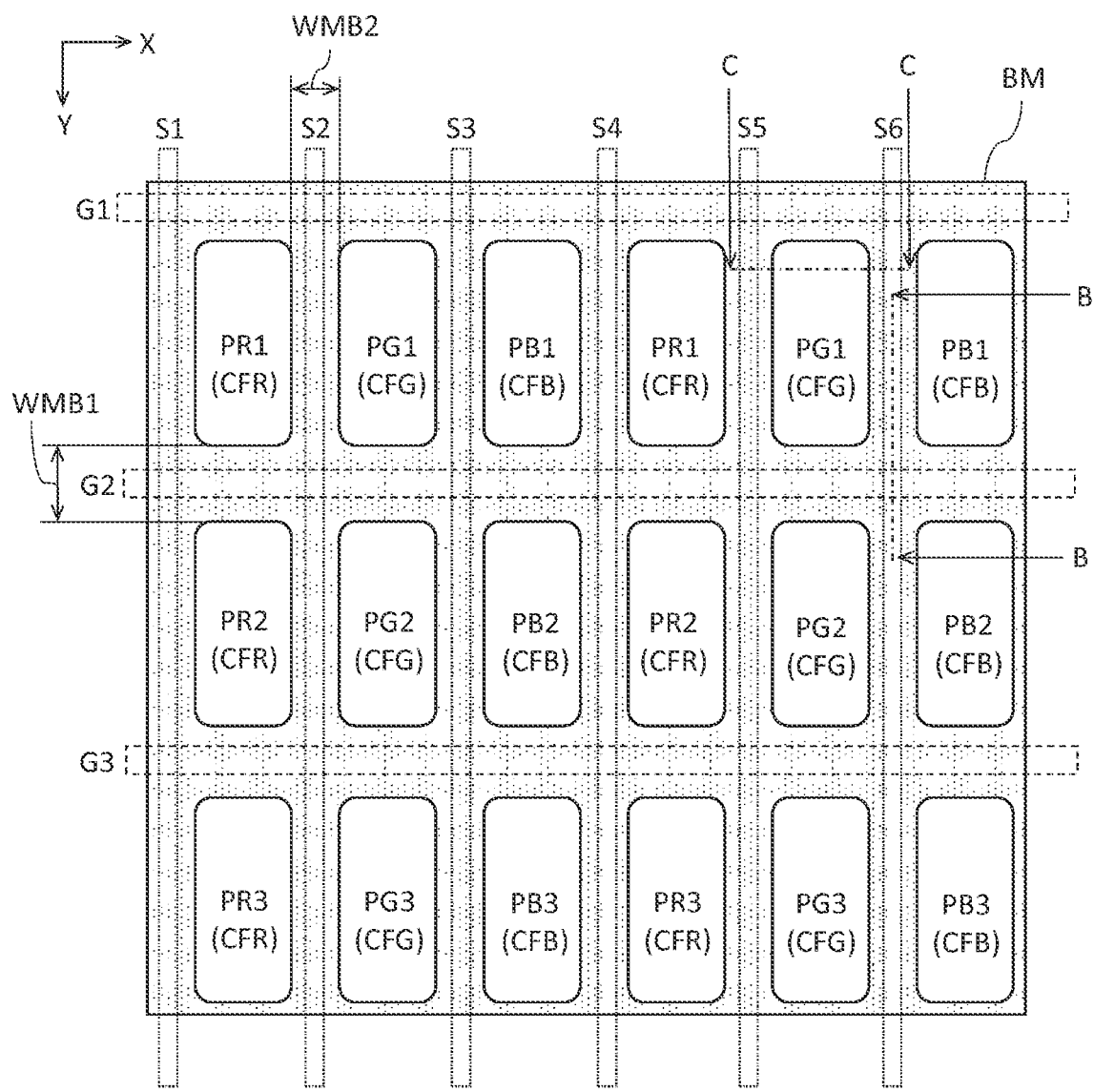

DISPLAY DEVICE

CROSS-REFERENCE TO RELATED APPLICATION

This application is a Continuation Application of PCT International Application No. PCT/JP2019/032776 filed on Aug. 22, 2019, which claims priority to Japanese Patent Application No. 2018-156198, filed on Aug. 23, 2018, the entire contents of which are incorporated herein by reference.

BACKGROUND OF THE INVENTION

The present invention relates to a display device. More specifically, the present invention is applicable to a display device having a non-driving section (non-displaying region) in a displaying region.

Among display devices, for example, a display device having an opening including a through hole formed in one portion of a displaying region including a plurality of pixels is proposed. The display device like this is disclosed in, for example, Japanese Patent Application No. 2010-54871. Also, a liquid crystal display device is proposed in which a transparent region is formed in a displaying region including a plurality of pixels without forming an opening penetrating through a glass substrate, thereby allowing a camera or sensors to be disposed so as to be overlapped with the transparent region. The display device like this is disclosed in, for example, U.S. Patent No. 2017/0123452. Further, Japanese Patent Application No. 2006-343728 discloses a liquid crystal display device having a configuration in which an opening of a polarization plate is formed in a transparent region.

SUMMARY OF THE INVENTION

The display device having the opening including the through hole in the one portion of the displaying region is provided with a wiring region for allowing a gate line (scan line) and a source line (signal line) to be detoured around the opening. The wiring region is also said to be a frame region. The width of the wiring region (frame region) is preferably narrow in order to enlarge the displaying region.

Forming the transparent region instead of forming the opening can prevent complicated manufacturing process and increased manufacturing cost, and as compared with the display device with the opening having the through hole in the glass substrate, forming the transparent region without the through hole in the glass substrate improves the rigidity and reliability of the display device.

An object of the present invention is to provide a display device capable of narrowing the width of a frame region provided in a displaying region.

Other objects and novel features will be apparent from the description of this specification and the accompanying drawings.

The overview of the representative invention of the present invention will be briefly described as follows.

That is, a display device has a display panel having a displaying section. The displaying section includes a first region having a plurality of pixels, and a second region having a non-driving region and a frame region provided so as to surround an outer circumference of the non-driving region and having an outer circumference surrounded by the first region. The frame region includes a first scan line, and a first signal line and a second signal line adjacent to each other. The first signal line has a first wide section, and the first signal line intersects the first scan line at the first wide section in plan view. The first scan line has a second wide section. The second signal line has a pair of third wide sections, and the second signal line intersects the second wide section of the first scan line at the pair of third wide sections in plan view. The first wide section of the first signal line is opposite to the second signal line between the pair of third wide sections without being opposite to the pair of third wide sections.

BRIEF DESCRIPTION OF THE DRAWINGS

FIG. 4 is a plan view of a rectangular region A indicated by a dotted line in FIG. 3;

DETAILED DESCRIPTION OF THE PREFERRED EMBODIMENTS

Figure 1:
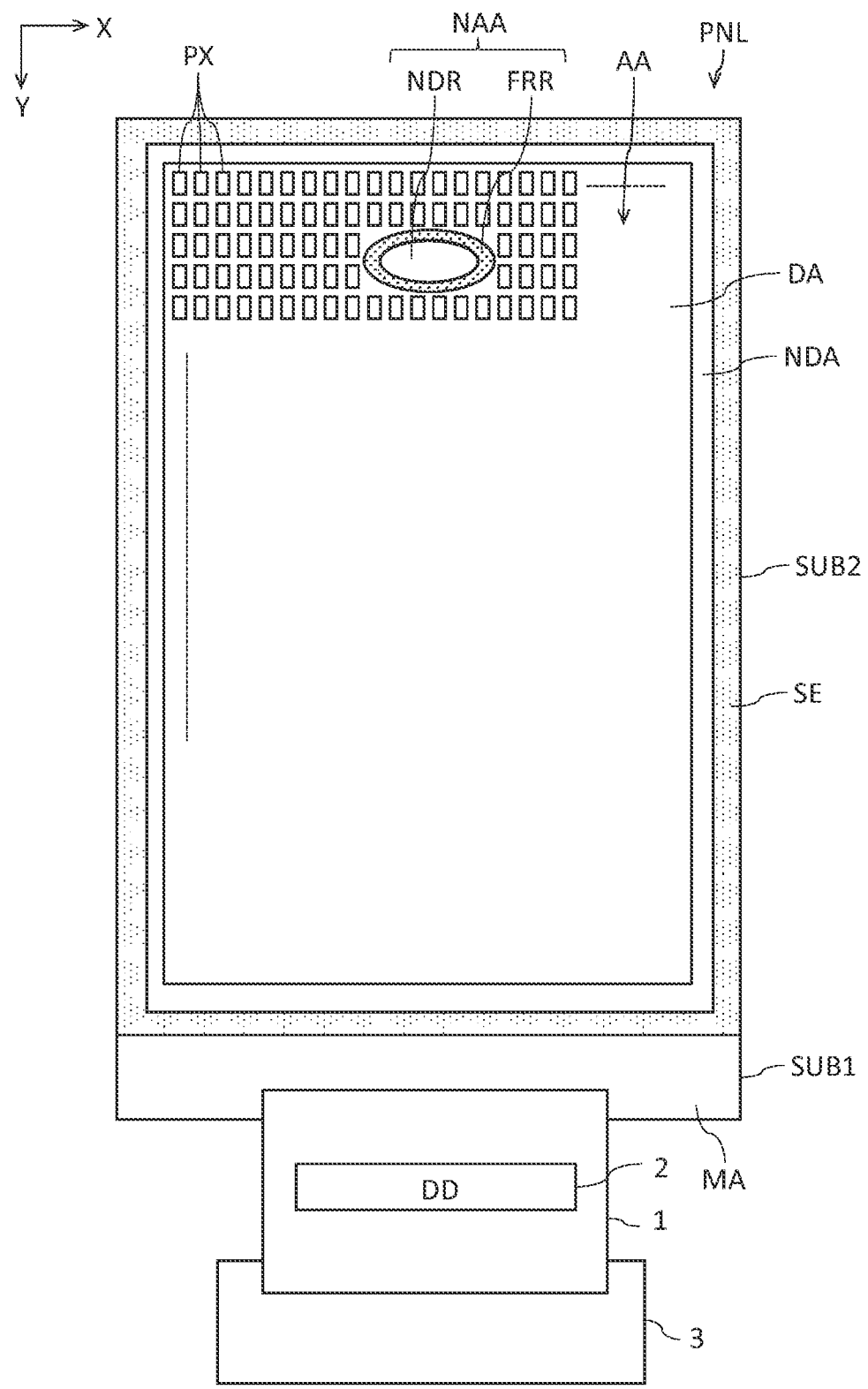
FIG. 1 is a plan view illustrating the appearance of a display device DSP according to an embodiment.

Respective embodiments of the present invention will be described below with reference to the drawings.

It should be noted that this disclosure is merely an example, and any appropriate change by holding the purport of the invention that can be readily conceived by those skilled in the art is, of course, encompassed in the scope of the present invention. Also, the width, thickness, shape, and the like of each portion are sometimes schematically illustrated in the drawings, as compared with the actual form, in order to make the description more clearly, but are merely an example, and do not limit the understanding of the present invention. Also, in this specification and the respective drawings, the same elements as those described previously with regard to the already described drawings are indicated by the same reference numerals, and the detailed description thereof is sometimes omitted as appropriate.

In these embodiments, as an example of a display device, a liquid crystal display device is disclosed. The liquid crystal display device can be used for various devices such as, for example, a smartphone, a tablet terminal, a mobile phone terminal, a personal computer, a television receiver, an in-vehicle device, and a game machine.

It should be noted that in this specification and the scope of claims, the expressions "up", "down", and the like in describing the drawings denote the relative position relationship between a structure body noted and another structure body. Specifically, when seen from the side, the direction from a first substrate (array substrate) toward a second substrate (opposing substrate) is defined as the "up", and the reverse direction is defined as the "down".

Also, "inside" and "outside" denote the relative position relationship between two portions based on a displaying region. That is, the "inside" refers to the side relatively closer to the displaying region with respect to one portion, and the "outside" refers to the side relatively farther from the displaying region with respect to the one portion. However, the "inside" and the "outside" referred to herein are defined in a state where the liquid crystal display device is not folded.

The "display device" refers to all display devices that display an image by using a display panel. The "display panel" refers to a structure body that displays the image by using an electric optical layer. For example, the term "display panel" sometimes refers to a display cell including the electric optical layer, and sometimes refers to a structure body in which other optical members (for example, a polarization member, a backlight, a touch panel, and the like) are mounted with respect to the display cell. Here, unless any technical inconsistency occurs, the "electric optical layer" can include a liquid crystal layer, an electro-chromic (EC) layer, and the like. Therefore, the embodiments described later will be described by illustrating, as the display panel, a liquid crystal panel including the liquid crystal layer, but the application to other display panels including the electric optical layer described above is not excluded.

(An Overall Configuration Example of the Display Device)

FIG. 1 is a plan view illustrating the appearance of a display device DSP of this embodiment. The display device DSP is provided with a display panel PNL, a flexible print circuit substrate 1, an IC chip 2, and a circuit substrate 3. The display panel PNL is a liquid crystal display panel, and is provided with a first substrate (also referred to as an array substrate) SUB1, a second substrate (also referred to as an opposing substrate) SUB2, a liquid crystal layer LC described later, and a seal material SE.

The display panel PNL is provided with a displaying section (displaying region) DA displaying an image, and a non-displaying section (non-displaying region) NDA in a frame shape surrounding the displaying section DA. The second substrate SUB2 is opposite to the first substrate SUB1. The first substrate SUB1 has a mounting section MA extended in a second direction Y with respect to the second substrate SUB2. The seal material SE is located to the non-displaying section NDA, bonds the first substrate SUB1 and the second substrate SUB2 to each other, and seals the liquid crystal layer LC.

The displaying section DA has a plurality of pixels PX, a non-driving region NDR in an elliptic shape, and a frame region FRR provided so as to surround the outer circumference of the non-driving region NDR. In this embodiment, the transparent region described above is called the non-driving region. In the displaying section DA, the plurality of pixels PX are disposed in a matrix shape in a first direction X and the second direction Y in the region except for the non-driving region NDR and the frame region FRR. The non-driving region NDR and the frame region FRR are provided in the displaying section DA, and the plurality of pixels PX are disposed therearound. In other words, the displaying section DA includes a first region AA and a second region NAA, the first region AA includes the plurality of pixels PX, and the second region NAA includes the non-driving region NDR and the frame region FRR. The second region NAA is surrounded by the first region AA. In this example, the non-driving region NDR having the elliptic shape in plan view is illustrated, but the shape of the non-driving region NDR is not limited to this. The shape of the non-driving region NDR may be a circular shape or a rectangular shape.

As described later, the plurality of pixels PX are not disposed in the non-driving region NDR, and the non-driving region NDR is the relatively transparent region, and allows, for example, a camera or sensors to be located therein.

In FIG. 1, the pixels PX each denote a minimum unit that can be controlled individually according to a pixel signal, and is sometimes referred to as a sub-pixel. Also, the minimum unit for achieving color display is sometimes referred to as a main pixel. The main pixel is configured to be provided with a plurality of sub-pixels PX displaying colors different from each other. In an example, the main pixel is provided, as the sub-pixels PX, with three sub-pixels: a red pixel displaying a red color, a green pixel displaying a green color, and a blue pixel displaying a blue color. Also, the main pixel may be provided with a white pixel displaying a white color.

The non-driving region NDR has an area more than at least one main pixel (three sub-pixels) in plan view. A gate wiring (also referred to as a scan line) intersecting or crossing the non-driving region NDR in the first direction X and an image signal wiring (also referred to as a signal line) intersecting or crossing the non-driving region NDR in the second direction Y are routably provided so as to be detoured around the non-driving region NDR. The non-driving region NDR can also be assumed as the transparent region that is optically transparent. The non-driving region NDR can also be defined as the region in which metal wiring layers (G, S, ML), a semiconductor layer (SC), and coloring layers (CFR, CFG, CFB) that interfere with optical transmission, such as color filters (CF: CFR, CFG, CFB) and a thin film transistor (TFT), which will be described later, are not formed.

The gate wiring and the image signal wiring routably provided so as to be detoured around the non-driving region NDR in plan view are disposed in the frame region FRR. Therefore, the frame region FRR has the role as a wiring region. The frame region FRR can also be said to be the non-displaying region. A light shield layer BML that is wide and will be described later is provided in the frame region FRR, and the light shield layer BML is provided so as to cover the frame region FRR in plan view.

The flexible print circuit substrate 1 is mounted on the mounting section MA, and is connected to the circuit substrate 3. The IC chip 2 is mounted on the flexible print circuit substrate 1. It should be noted that the IC chip 2 may be mounted on the mounting section MA. The IC chip 2 incorporates a display driver DD outputting a signal necessary for image display in a display mode displaying an image.

The display panel PNL of this embodiment may be of any one of a transmissive type provided with a transmissive display function displaying an image by selectively transmitting light from the rear face side of the first substrate SUB 1, a reflective type provided with a reflective display function displaying an image by selectively reflecting light from the front face side of the second substrate SUB2, or a semi-transmissive type provided with the transmissive display function and the reflective display function.

Also, the description of the detailed configuration of the display panel PNL is omitted here, but the display panel PNL may be provided with any configuration corresponding to a display mode using a vertical electric field along the normal line of a substrate principal plane, a display mode using an inclined electric field inclined in an oblique direction with respect to the substrate principal plane, or further, a display mode using a lateral electric field, the above-described vertical electric field, and the above-described inclined electric field in such a manner that they are combined with each other as appropriate. The substrate principal plane here is the plane parallel to an X-Y plane defined in the first direction X and the second direction Y.

(A Circuit Configuration Example of the Display Device)

Figure 2:
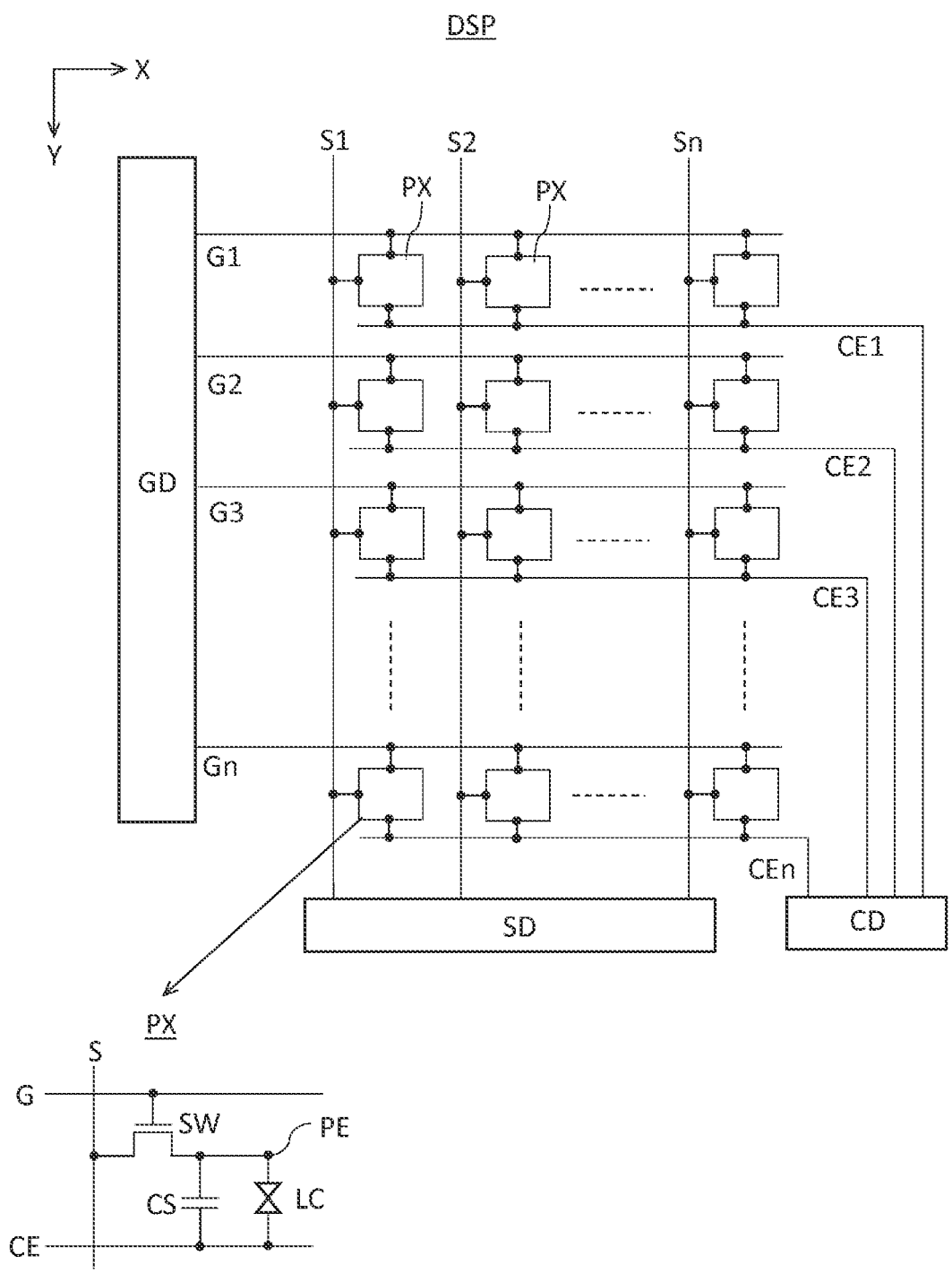
FIG. 2 is a diagram illustrating the basic configuration of each pixel PX and an equivalent circuit of the display device DSP.

FIG. 2 is a diagram illustrating the basic configuration of each pixel PX and an equivalent circuit of the display device DSP. The plurality of pixels PX are disposed in the matrix shape in the first direction X and the second direction Y. A plurality of scan lines G (G1, G2 . . . ) are connected to a scan line driving circuit GD. A plurality of signal lines S (S1, S2 . . . ) are connected to a signal line driving circuit SD. A plurality of shared electrodes CE (CE1, CE2 . . . ) are connected to a voltage supplying section CD of a common voltage (Vcom), and are disposed across the plurality of pixels PX. One pixel PX is connected to one scan line, one signal line, and one shared electrode CE. It should be noted that the scan line G and the signal line S are not necessarily required to be linearly extended, and one portion of each of them may be bent. For example, the signal line S is extended in the second direction Y even though one portion thereof is bent.

Each pixel PX is provided with a switching element SW, a pixel element PE, the shared electrode CE, the liquid crystal layer LC, and the like. The switching element SW is configured of, for example, the thin film transistor (TFT), and is electrically connected to the scan line G and the signal line S. The scan line G is connected to the switching element SW in each of the pixels PX aligned in the first direction X. The signal line S is connected to the switching element SW in each of the pixels PX aligned in the second direction Y. The pixel electrode PE is electrically connected to the switching element SW. Each pixel electrode PE is opposite to the shared electrode CE, and drives the liquid crystal layer LC by the electric field generated between the pixel electrode PE and the shared electrode CE. A holding capacity CS is formed, for example, between the electrode at the same potential as the shared electrode CE and the electrode at the same potential as the pixel electrode PE.

(A Configuration Example of the Light Shield Layer)

Figure 3:
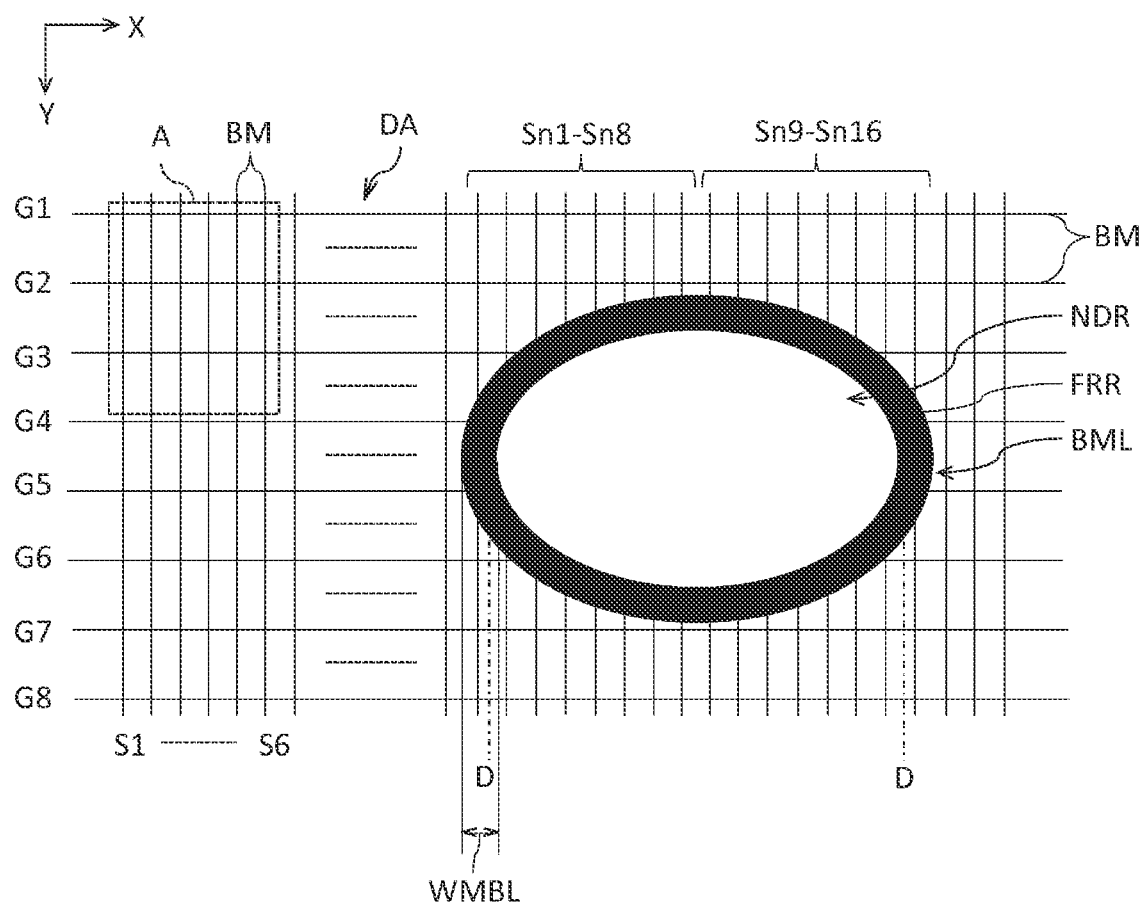
FIG. 3 is a plan view illustrating a disposing example of light shield layers of a display panel.

FIG. 3 is a plan view illustrating a disposing example of the light shield layers of the display panel.

Light shield layers (first light shield layers) BM are provided in a grid shape in the first direction X and the second direction Y in the displaying region DA except for the non-driving region NDR and the frame region FRR, that is, in the first region AA. In the light shield layers BM provided in the grid shape, the scan lines G (G1 to G8) are disposed on the lower sides of the light shield layers BM extended in the first direction X, and the signal lines S (S1 to S6, Sn1 to Sn8, Sn9 to Sn16) are disposed on the lower sides of the light shield layers BM extended in the second direction Y. Each pixel (sub-pixel) is disposed in the rectangular region between the light shield layers BM provided in the grid shape. In FIG. 3, the scan lines G1 to G8 and the signal lines S1 to S6, Sn1 to Sn8, and Sn9 to Sn16 are illustratively shown, but other scan lines that are not illustrated or are not indicated by the reference numerals have the same configuration as the scan lines G1 to G8, and other signal lines that are not illustrated or are not indicated by the reference numerals also have the same configuration as the signal lines S1 to S6, Sn1 to Sn8, and Sn9 to Sn16.

The light shield layer (second light shield layer) BML in a plate shape having a width (WMBL) larger than the vertical and lateral line widths of the light shield layers BM provided in the grid shape is provided in the frame region FRR. That is, the non-driving region NDR is the region surrounded by the light shield layer BML having the large width. In FIG. 3, a state where the light shield layer BML in the plate shape is formed in an elliptic shape in plan view is illustrated.

In this example, four scan lines G3 to G6 correspond to the scan lines intersecting or crossing the non-driving region NDR, and sixteen signal lines Sn1 to Sn8 and Sn9 to Sn16 correspond to the signal lines intersecting or crossing the non-driving region NDR.

The four scan lines G3 to G6 are routed into the frame region FRR so as to be detoured around the non-driving region NDR. In plan view, the scan lines G3 and G4 are disposed so as to be detoured into the frame region FRR corresponding to the upper side of the non-driving region NDR, and the scan lines G5 and G6 are disposed so as to be detoured into the frame region FRR corresponding to the lower side of the non-driving region NDR.

The sixteen signal lines Sn1 to Sn8 and Sn9 to Sn16 are routed into the frame region FRR so as to be detoured around the non-driving region NDR. In plan view, the eight signal lines Sn1 to Sn8 are disposed so as to be detoured into the frame region FRR corresponding to the left side of the non-driving region NDR, and the eight signal lines Sn9 to Sn16 are disposed so as to be detoured into the frame region FRR corresponding to the right side of the non-driving region NDR.

FIG. 4 is a plan view of a rectangular region A indicated by a dotted line in FIG. 3. In FIG. 4, the scan lines G1 to G3, the signal lines S1 to S6, a plurality of sub-pixels (PR1, PG1, PB1, PR2, PG2, PB2, PR3, PG3, PB3), and the light shield layers BM in the grid shape are drawn.

The scan lines G1 to G3 are extended along the first direction X on the lower sides of the light shield layers BM provided along the first direction X, and are provided side by side in the second direction Y. The signal lines S1 to S6 are extended along the second direction Y on the lower sides of the light shield layers BM provided along the second direction X, and are provided side by side in the first direction X. A width WMB1 of each of the light shield layers BM provided along the first direction X is larger than a width WMB2 of each of the light shield layers BM provided along the second direction Y (WMB1>WMB2). Also, the width WMBL of the light shield layer BML is larger than the widths WMB1 and WMB2 of each of the light shield layers BM (WMBL>WMB1>WMB2).

In the portion that is the region surrounded by a pair of scan lines and a pair of signal lines and in which no light shield layers BM are provided, each of the plurality of sub-pixels (PR1, PG1, PB1, PR2, PG2, PB2, PR3, PG3, PB3) is disposed. Each of the sub-pixels PR1, PR2, and PR3 denotes the red pixel, and has the red color filter CFR. Each of the sub-pixels PG1, PG2, and PG3 denotes the green pixel, and has the green color filter CFG. Each of the sub-pixels PB1, PB2, and PB3 denotes the blue pixel, and has the blue color filter CFB. One main pixel for the color display is configured of three sub-pixels ((PR1, PG1, PB1), (PR2, PG2, PB2), or (PR3, PG3, PB3)). Here, the color filters CFR, CFG, and CFB can be assumed as the coloring layers.

(A Configuration Example of the Cross-Sectional View of the Display Panel)

Figure 5:
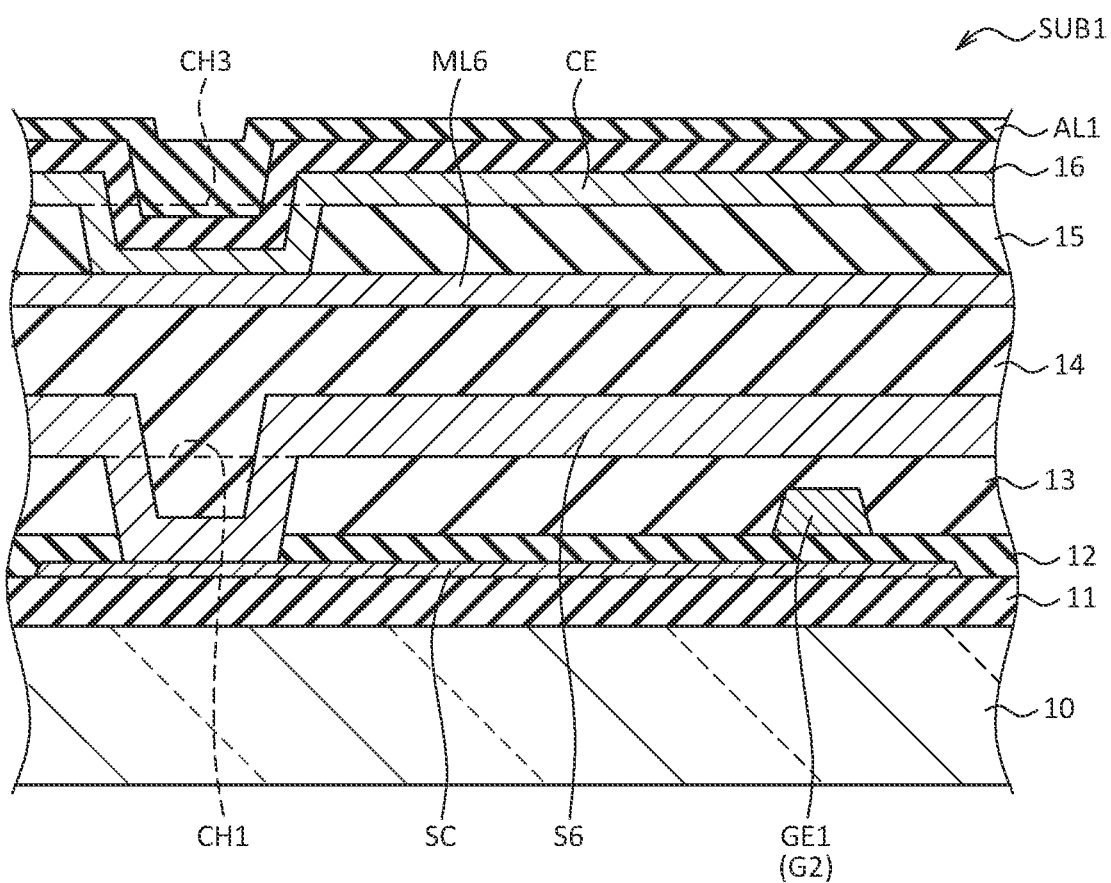
FIG. 5 is a cross-sectional view of a first substrate SUB1 taken along lines B-B in FIG. 4.
Figure 6:
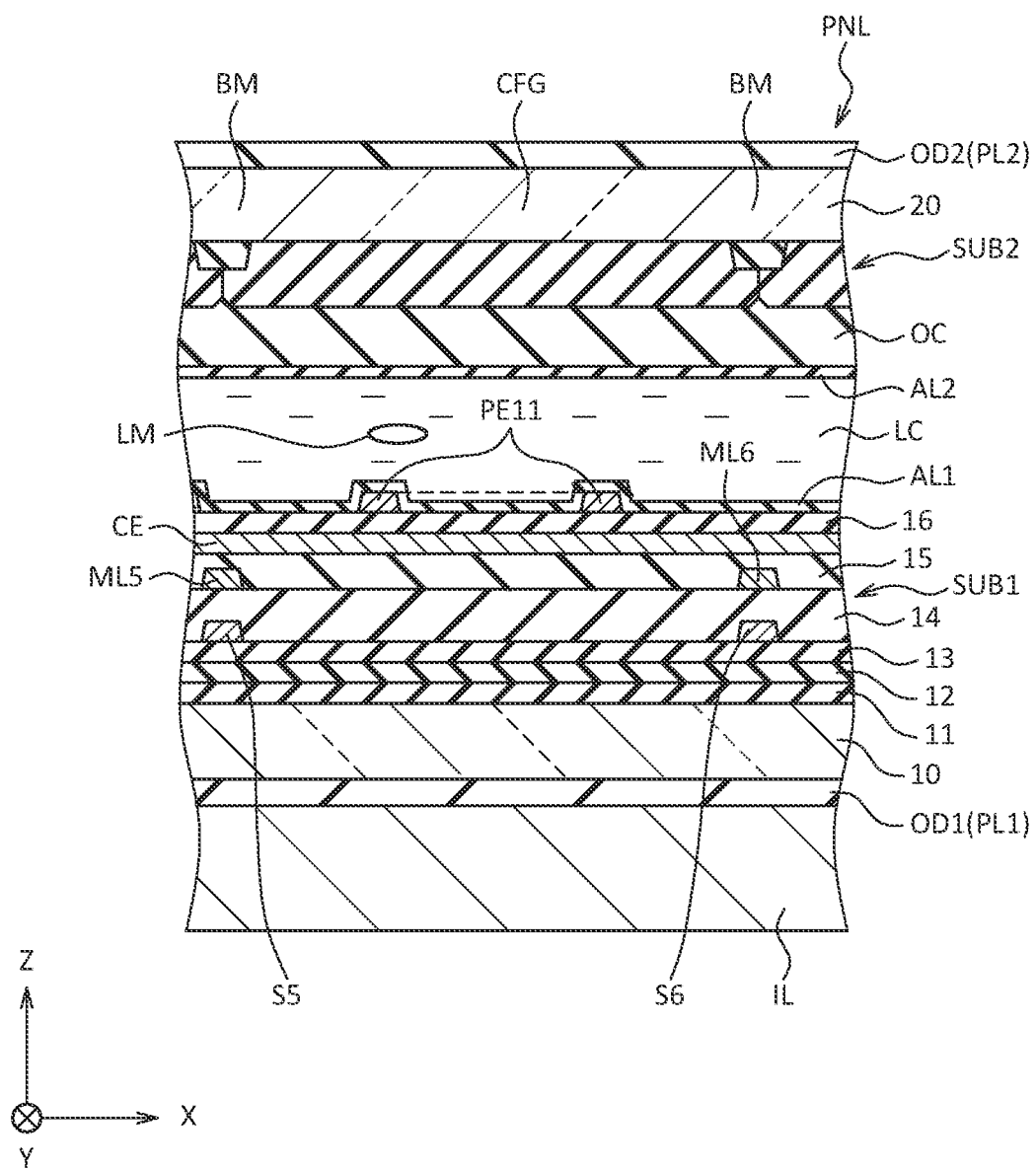
FIG. 6 is a cross-sectional view of a displaying region DA (first region AA) taken along lines C-C in FIG. 4.
Figure 7:
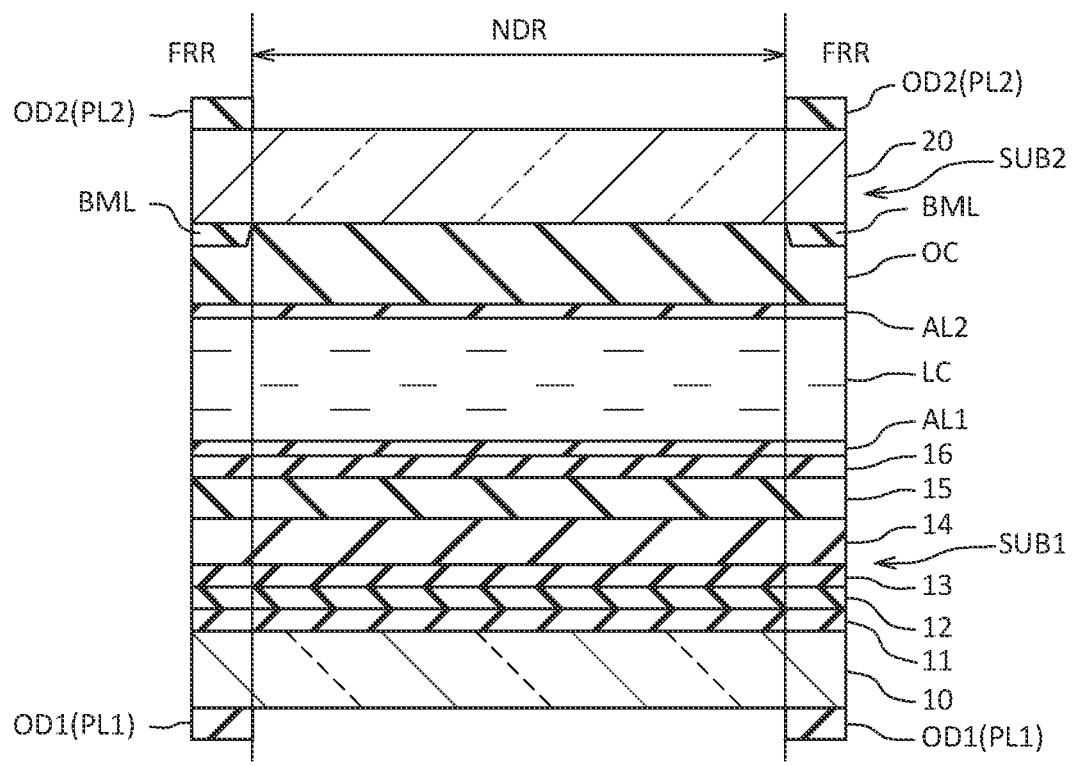
FIG. 7 is a cross-sectional view of a non-driving region NDR between lines D-D in FIG. 3 and a frame region FRR provided therearound.

FIG. 5 is a cross-sectional view of the first substrate SUB1 taken along lines B-B in FIG. 4. FIG. 6 is a cross-sectional view of the displaying region DA (first region AA) taken along lines C-C in FIG. 4. FIG. 7 is a cross-sectional view of the non-driving region NDR between lines D-D in FIG. 3 and the frame region FRR provided therearound.

Referring to FIG. 5, the first substrate SUB1 is provided with an insulation substrate 10, insulation films 11 to 16, the semiconductor layer SC, the scan line (first metal wiring) G2, the signal line (second metal wiring) S6, a metal wiring (third metal wiring) ML6, the shared electrode (first transparent electrode) CE, an orientation film AL1, and the like.

The insulation substrate 10 is the substrate having optical transmission properties, such as a glass substrate and a flexible resin substrate. The insulation film 11 is located on the insulation substrate 10. The semiconductor layer SC is located on the insulation film 11 that is an under coat film, and is covered by the insulation film 12 that is a gate insulation film. The semiconductor layer SC is formed of, for example, polycrystalline silicon, but may be formed of amorphous silicon or an oxide semiconductor.

A gate electrode GE1 that is one portion of the scan line G2 is located on the insulation film 12, and is covered by the insulation film (inorganic insulation film) 13. It should be noted that other scan lines, not illustrated, are also located at the same layer as the scan line G2. The scan line G2 is formed of a metal material, such as aluminum (Al), titanium (Ti), silver (Ag), molybdenum (Mo), tungsten (W), copper (Cu), and chrome (Cr), an alloy made by combining these metal materials, and the like, and may have a single-layer structure or a multilayer structure. In an example, the scan line G2 is formed of a molybdenum-tungsten alloy.

The signal line S6 is located on the insulation film 13, and is covered by the insulation film (first organic insulation film) 14. It should be noted that other signal lines, not illustrated, are also located at the same layer as the signal line S6. The signal line S6 is formed of the above-described metal materials, an alloy made by combining the above-described metal materials, and the like, and may have a single-layer structure or a multilayer structure. In an example, the signal line S6 is a stack body made by stacking titanium (Ti), aluminum (Al), and titanium (Ti) in this order. The signal line S6 contacts the semiconductor layer SC through a contact hole CH1 penetrating through the insulation film 12 and the insulation film 13.

The metal wiring ML6 is located on the insulation film 14, and is covered by the insulation film (second organic insulation film) 15. The metal wiring ML6 is formed of the above-described metal materials, an alloy made by combining the above-described metal materials, and the like, and may have a single-layer structure or a multilayer structure. In an example, the metal wiring ML6 is a stack body made by stacking molybdenum (Mo), aluminum (Al), and molybdenum (Mo) in this order. It should be noted that the metal wiring ML6 may be a stack body made by stacking titanium (Ti), aluminum (Al), and titanium (Ti) in this order.

The shared electrode CE is located on the insulation film 15, and is covered by the insulation film (inorganic insulation film) 16. The shared electrode CE is a transparent electrode formed of a transparent conducting material such as indium tin oxide (ITO) and indium zinc oxide (IZO). The shared electrode CE contacts the metal wiring ML6 through a contact hole CH3 penetrating through the insulation film 15. The orientation film AL1 is located on the insulation film 16.

Each of the insulation films 11 to 13 and the insulation film 16 is the inorganic insulation film formed of an inorganic insulation material such as a silicon oxide, a silicon nitride, and a silicon oxynitride, and may have a single-layer structure or a multilayer structure. Each of the insulation films 14 and 15 is the organic insulation film formed of an organic insulation material such as, for example, an acryl resin. It should be noted that the insulation film 15 may be the inorganic insulation film.

Referring to FIG. 6, in the first substrate SUB1, the signal lines S5 and S6 are located on the insulation film 13, and are covered by the insulation film 14. A metal wiring ML5 is located immediately above the signal line S5, and the metal wiring ML6 is located immediately above the signal line S6. Pixel electrodes PE11 are located on the insulation film 16, and are covered by the orientation film AL1. Each of the pixel electrodes PE11 is the transparent electrode formed of the transparent conducting material, such as ITO and IZO.

The second substrate SUB2 is provided with an insulation substrate 20, the light shield layers BM, the color filter CFG, an over coat layer OC, an orientation film AL2, and the like.

Like the insulation substrate 10, the insulation substrate 20 is the substrate having optical transmission properties such as the glass substrate and the resin substrate. The light shield layers BM and the color filter CFG are located on the side of the insulation substrate 20 opposite to the first substrate SUB1. The color filter CFG is disposed at the position opposite to the pixel electrodes (second transparent electrodes) PE11, and has one portion overlapped with each light shield layer BM. The over coat layer OC covers the color filter CFG. The over coat layer OC is formed of a transparent resin. Like the color filter CFG, each of the other color filters CFR and CFB is also disposed at the position opposite to the pixel electrodes PE, and is also covered by the over coat layer OC. The orientation film AL2 covers the over coat layer OC. Each of the orientation film AL1 and the orientation film AL2 is formed of, for example, a material exhibiting horizontal orientation properties.

The first substrate SUB1 and the second substrate SUB2 described above are disposed so that the orientation film AL1 and the orientation film AL2 are opposite to each other. Although not illustrated, a main spacer and a sub-spacer are disposed between the first substrate SUB1 and the second substrate SUB2. The main spacer forms a predetermined cell gap between the orientation film AL1 and the orientation film AL2. The cell gap is, for example, 2 to 5 μm. The first substrate SUB1 and the second substrate SUB2 are bonded to each other by the seal material in a state where the predetermined cell gap is formed.

The liquid crystal layer LC is located between the first substrate SUB1 and the second substrate SUB2, and is held between the orientation film AL1 and the orientation film AL2. The liquid crystal layer LC is provided with a liquid crystal molecule LM. The liquid crystal layer LC is configured of a liquid crystal material of a positive type (the dielectric constant anisotropy is positive), or a liquid crystal material of a negative type (the dielectric constant anisotropy is negative).

An optical element OD1 including a polarization plate PL1 is bonded to the insulation substrate 10. An optical element OD2 including a polarization plate PL2 is bonded to the insulation substrate 20. It should be noted that the optical element OD1 and the optical element OD2 may be provided with a phase difference plate, a scattering layer, an antireflective layer, and the like, if necessary.

In such the display panel PNL, in the off state where the electric field is not formed between the pixel electrode PE and the shared electrode CE, the liquid crystal molecule LM is initially oriented in a predetermined direction between the orientation film AL1 and the orientation film AL2. In the off state like this, light emitted from an illumination device IL toward the display panel PNL is absorbed by the optical element OD1 and the optical element OD2, resulting in dark display. On the other hand, in the on state where the electric field is formed between the pixel electrode PE and the shared electrode CE, the liquid crystal molecule LM is oriented in a direction different from the initial orientation direction by the electric field, and the orientation direction is controlled by the electric field. In the on state like this, part of the light from the illumination device IL transmits through the optical element OD1 and the optical element OD2, resulting in bright display.

Referring to FIG. 7, in the non-driving region NDR and the frame region FRR, as described in FIG. 6, the first substrate SUB1 is provided with the insulation substrate 10, the insulation films 11 to 16, the orientation film AL1, and the like. However, as seen from the comparison of FIGS. 7 and 6, the semiconductor layer SC, the optical element OD1 including the polarization plate PL1, the scan line G, the signal line S, the metal wiring ML, the shared electrode CE, the illumination device IL, and the like are not disposed in the non-driving region NDR. Also, the scan line G and the signal line S in the frame region are omitted in FIG. 7.

As described in FIG. 6, in the non-driving region NDR, the second substrate SUB2 is provided with the insulation substrate 20, the over coat layer OC, the orientation layer AL2, and the like. However, as seen from the comparison of FIGS. 7 and 6, the optical element OD2 including the polarization plate PL2, the light shield layer BM, and the color filters (CFR, CFG, CFB) are not provided. That is, the metal wiring layers (G, S, ML), the semiconductor layer (SC), the light shield layers BM, and the coloring layers (CFR, CFG, CFB) that interfere with the optical transmission are not formed in the non-driving region NDR.

On the other hand, in the frame region FRR, the second substrate SUB2 is provided with the light shield layer BML on the left side and the right side of the non-driving region NDR. As described in FIG. 4, the light shield layer BML is provided so as to surround the outer circumference of the non-driving region NDR in plan view.

In the non-driving region NDR and the frame region FRR, the liquid crystal layer LC is located between the first substrate SUB1 and the second substrate SUB2, and is held between the orientation film AL1 and the orientation film AL2.

As described in FIG. 7, the optical element OD1 including the polarization plate PL1 and the optical element OD2 including the polarization plate PL2 are not formed in the non-driving region NDR. As described above, the plurality of pixels PX are not disposed in the non-driving region NDR, and the non-driving region NDR is the relatively transparent region, and allows, for example, the camera and sensors to be located therein. For that, the transparency in the non-driving region NDR is an important element, and the optical element such as the polarization plate is likely to reduce the transparency. However, other than the configuration in FIG. 7 in which the optical elements such as the polarization plates are not formed in both of the first substrate SUB1 and the second substrate SUB2, a configuration in which, for example, the polarization plate is formed only in one of the first substrate SUB1 and the second substrate SUB2 in the non-driving region NDR and the polarization plate is not formed in the other of the first substrate SUB1 and the second substrate SUB2 in the non-driving region NDR may be employed.

For example, in a configuration in which the polarization plate PL1 is formed in the non-driving region NDR of the first substrate SUB1 and the polarization plate PL2 is not formed in the non-driving region NDR of the second substrate SUB2, the hole in the polarization plate PL2 die-cut along the non-driving region NDR of the second substrate SUB2 can be visually identified by the user, and in a configuration in which the polarization plate PL1 is not formed in the non-driving region NDR of the first substrate SUB1 and the polarization plate PL2 is formed in the non-driving region NDR of the second substrate SUB2, the hole in the polarization plate formed along the non-driving region is unlikely to be visually identified. In any case, the process so as to form the holes in the polarization plates PL formed along the non-driving region NDR increases the cost, so that forming the hole in only one of the polarization plates PL leads to cost reduction while reducing the processing cost.

(A Configuration Example of the Detour Wiring of the Frame Region FRR)

Figure 8:
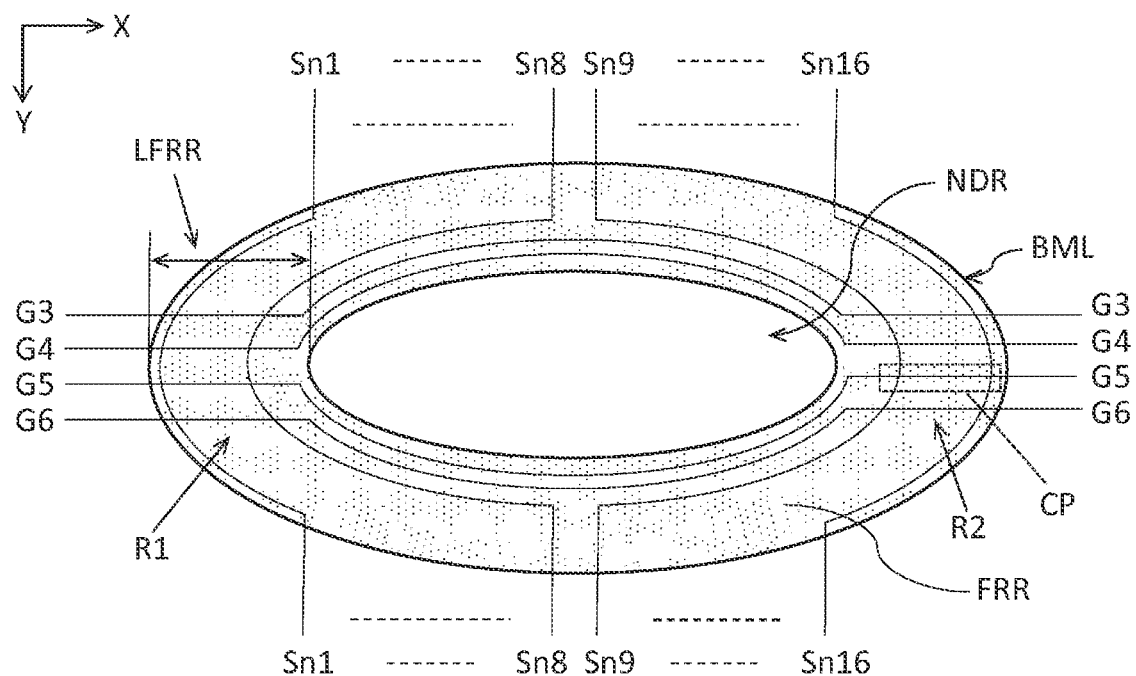
FIG. 8 is a conceptual plan view for explaining the detour wiring of the frame region FRR.

FIG. 8 is a conceptual plan view for explaining the detour wiring of the frame region FRR. It should be noted that as described in FIG. 5, the scan line (G2) and the signal line (S6) are present in the different wiring layers across the insulation film 13, and the scan line (G2) and the signal line (S6) can intersect each other.

As illustrated in FIG. 8, the scan lines G3 and G4 are first extended in the first direction X from the displaying region DA into the frame region FRR, are disposed in the frame region FRR so as to be detoured in the region of the frame region FRR corresponding to the upper side of the non-driving region NDR, and are then extended in the first direction X again from the frame region FRR into the displaying region DA. The scan lines G5 and G6 are first extended in the first direction X from the displaying region DA into the frame region FRR, are disposed in the frame region FRR so as to be detoured in the frame region FRR corresponding to the lower side of the non-driving region NDR, and are then extended in the first direction X again from the frame region FRR into the displaying region DA.

The signal lines Sn1 to Sn8 are first extended in the second direction Y from the displaying region DA into the frame region FRR, are disposed in the frame region FRR so as to be detoured in the frame region FRR corresponding to the left side of the non-driving region NDR, and are then extended in the second direction Y again from the frame region FRR into the displaying region DA. The signal lines Sn9 to Sn16 are first extended in the second direction Y from the displaying region DA into the frame region FRR, are disposed in the frame region FRR so as to be detoured in the frame region FRR corresponding to the right side of the non-driving region NDR, and are then extended in the second direction Y again from the frame region FRR into the displaying region DA.

Therefore, the scan lines G3 to G6 and the signal lines Sn1 to Sn8 intersect each other in a region R1 of the frame region FRR corresponding to the left side of the non-driving region NDR in plan view. Also, the scan lines G3 to G6 and the signal lines Sn9 to Sn16 intersect each other in a region R2 of the frame region FRR corresponding to the right side of the non-driving region NDR.

A width LFRR of the frame region FRR is decided according to the configuration of the intersecting portions of the scan lines G3 to G6 and the signal lines Sn1 to Sn8 or Sn9 to Sn16. The width LFRR of the frame region FRR is required to be narrowed.

(A Configuration Example of the Intersecting Portion of the Scan Line and the Signal Line)

Next, a configuration example of the intersecting portion of the scan line and the signal line will be described with reference to the drawings. First, a comparative example studied by the inventors will be described, and next, a configuration example according to an embodiment will be described. In the following description, a configuration example of the intersecting portion of the scan line G5 and each of the signal lines Sn9 to Sn16 with respect to an intersecting portion CP illustrated in FIG. 8 will be illustratively described, but this is ditto for configuration examples of the intersecting portions of other scan lines and other signal lines.

Figure 9:
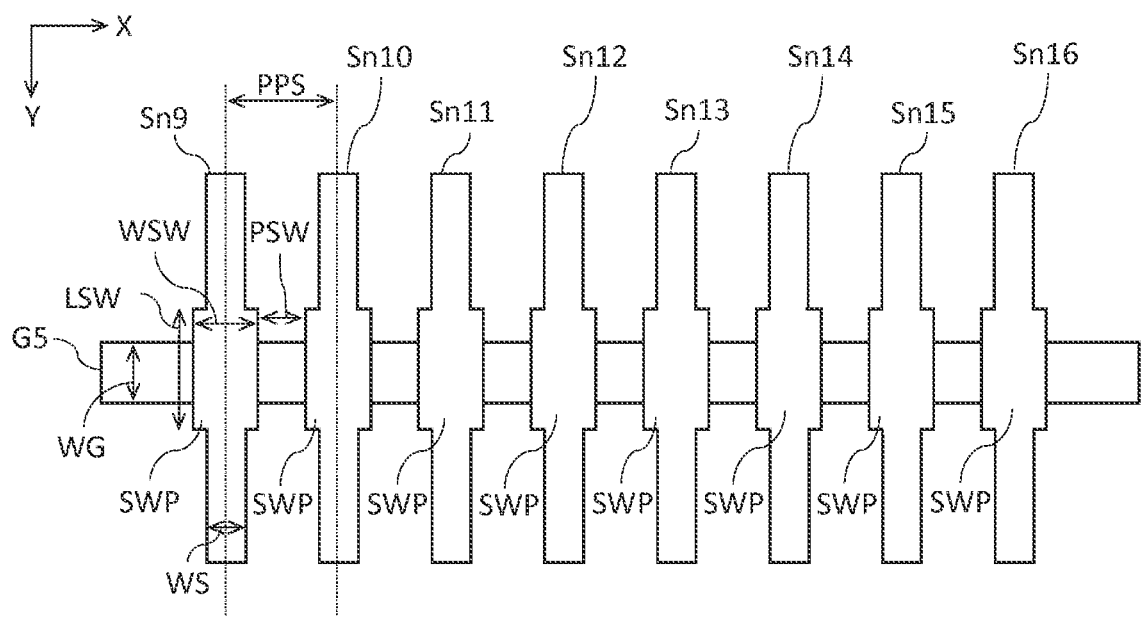
FIG. 9 is a plan view illustrating the configuration of the intersecting portion of a scan line and a signal line according to a comparative example.

FIG. 9 is a plan view illustrating the configuration of the intersecting portion of the scan line and the signal line according to the comparative example. The scan line G5 extended in the first direction X intersects each of the signal lines Sn9 to Sn16 extended in the second direction Y. A width WG of the scan line G5 is uniform, and is, for example, approximately 3 µm.

Each of the signal lines Sn9 to Sn16 has a wide section SWP at the portion intersecting the scan line G5. The wide section SWP is provided to prevent the disconnection of each of the signal lines Sn9 to Sn16 at the portion intersecting the scan line G5. That is, the presence of the scan line G5 can cause a step in the insulation film 13. Each of the signal lines Sn9 to Sn16 provided on the insulation film 13 can be disconnected due to the step. Specifically, the signal line S becomes thinner during processing in the step in which the signal line Sn passes over the scan line G, and as a result, the disconnection is a concern. Thus, by providing the wide section SWP, the disconnection of each of the signal lines Sn9 to Sn16 can be prevented. Even when the signal lines Sn9 to Sn16 are thinned during the processing of the signal lines S, the signal lines Sn9 to Sn16 each having the wide section SWP are prevented from being thinned to an extent that disconnects the signal lines Sn9 to Sn16. A width WS of each of the signal lines Sn9 to Sn16 is, for example, approximately 2.3 µm. A width WSW of the wide section SWP is, for example, approximately 2.6 µm. A length LSW of the wide section SWP is, for example, approximately 6.0 µm. A distance PSW between the adjacent wide sections SWP is, for example, approximately 2.4 µm. Also, a wiring pitch PPS of the signal lines Sn9 and Sn10, Sn10 and Sn11, Sn11 and Sn12, Sn12 and Sn13, Sn13 and Sn14, Sn14 and Sn15, or Sn15 and Sn16 is, for example, approximately 5.0 µm.

In the configuration example of the comparative example in FIG. 9, each of the signal lines Sn9 to Sn16 has the wide section SWP at the portion intersecting the scan line G5, so that it is difficult to narrow the distance PSW between the wide sections SWP due to the prevention of the short-circuit between the signal lines. Therefore, there is a problem that the wiring pitch PPS of the signal lines Sn9 and Sn10, Sn10 and Sn11, Sn11 and Sn12, Sn12 and Sn13, Sn13 and Sn14, Sn14 and Sn15, or Sn15 and Sn16 cannot also be narrowed.

Figure 10:
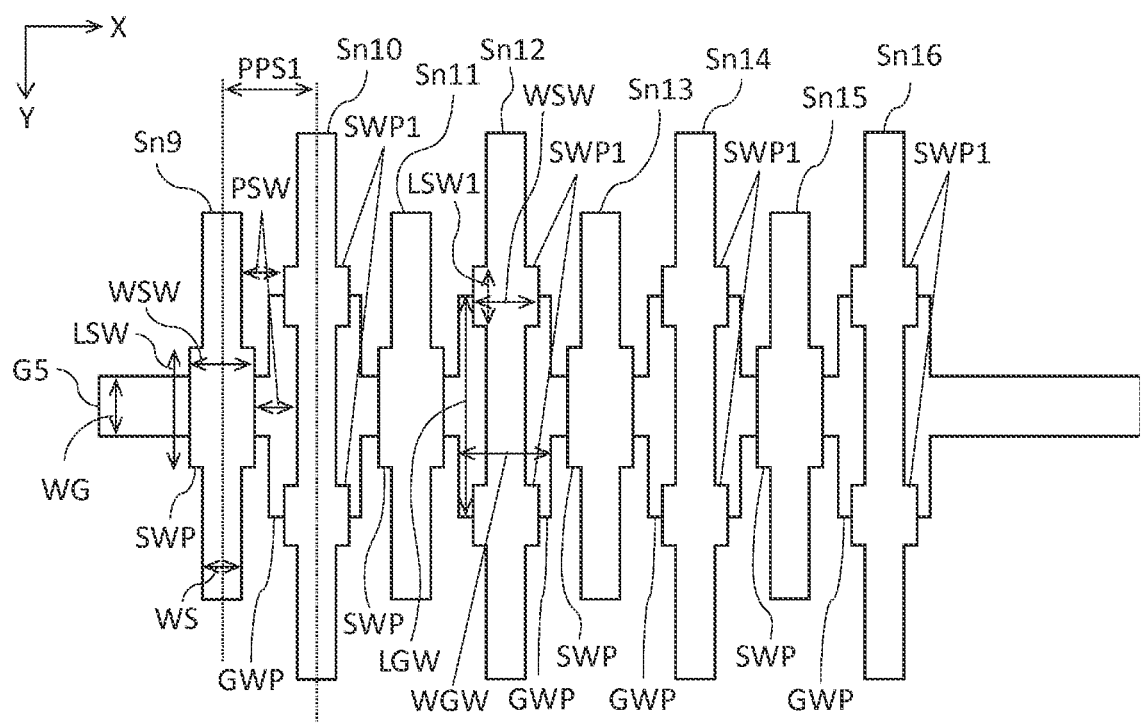
FIG. 10 is a plan view illustrating a configuration example of the intersecting portion of the scan line and the signal line according to an embodiment.

FIG. 10 is a plan view illustrating a configuration example of the intersecting portion of the scan line and the signal line according to an embodiment.

In FIG. 10, unlike the scan line G5 having a uniform width illustrated in FIG. 9, the scan line G5 has a plurality of wide sections GWP, and the scan line G5 and the signal lines Sn10, Sn12, Sn14, and Sn16 intersect each other at the plurality of wide sections GWP.

Like FIG. 9, each of the signal lines Sn9, Sn11, Sn13, and Sn15 has the wide section (first wide section) SWP at the portion intersecting the scan line G5.

Each of the signal lines Sn10, Sn12, Sn14, and Sn16 has a pair of wide sections (second wide sections) SWP1, and intersects the corresponding wide section GWP of the scan line G5 at the pair of wide sections SWP1. One of the pair of wide sections SWP1 is disposed corresponding to the upper side portion of the wide section GWP. The other of the pair of wide sections SWP1 is disposed corresponding to the lower side portion of the wide section GWP. That is, by providing the wide section GWP in the scan line G5, the wide section SWP and the pair of wide sections SWP1 can be disposed so that the wide section SWP and the pair of wide sections SWP1 are not opposite to each other between the adjacent signal lines. This can reduce a wiring pitch PPS1 of the signal lines Sn9 and Sn10, Sn10 and Sn11, Sn11 and Sn12, Sn12 and Sn13, Sn13 and Sn14, Sn14 and Sn15, or Sn15 and Sn16, as compared with the wiring pitch PPS of the signal lines Sn9 and Sn10, Sn10 and Sn11, Sn11 and Sn12, Sn12 and Sn13, Sn13 and Sn14, Sn14 and Sn15, or Sn15 and Sn16 in FIG. 9.

In the scan line G5, the width WG of the scan line G5 at the portion in which the wide section GWP is not provided is, for example, approximately 3 µm. A width WGW of the wide section GWP is, for example, approximately 3 µm. A length LGW of the wide section GWP is, for example, approximately 10 µm.

The width WS of each of the signal lines Sn9 to Sn16 and the width WSW and the length LSW of the wide section SWP each have the same value as that described in FIG. 9. The width WSW of the wide section SWP1 is the same as the width WSW of the wide section SWP. A length LSW1 of the wide section SWP1 is, for example, approximately 3 µm.

The distance PSW between the wide section SWP1 of the signal line (Sn10) and the adjacent signal line (Sn9) and the distance PSW between the wide section SWP of the signal line (Sn9) and the adjacent signal line (Sn10) are the same, and are also the same as the distance PSW between the wide sections SWP described in FIG. 9.

In the configuration illustrated in FIG. 10, the wiring pitch PPS1 of the signal lines Sn9 and Sn10, Sn10 and Sn11, Sn11 and Sn12, Sn12 and Sn13, Sn13 and Sn14, Sn14 and Sn15, or Sn15 and Sn16 can be, for example, approximately 4.85 µm. The wiring pitch PPS1 of the signal lines Sn9 and Sn10, Sn10 and Sn11, Sn11 and Sn12, Sn12 and Sn13, Sn13 and Sn14, Sn14 and Sn15, or Sn15 and Sn16 can be reduced by approximately 3% with respect to the wiring pitch PPS of the signal lines Sn9 and Sn10, Sn10 and Sn11, Sn11 and Sn12, Sn12 and Sn13, Sn13 and Sn14, Sn14 and Sn15, or Sn15 and Sn16 in FIG. 9. Therefore, the width LFRR of the frame region FRR can also be narrowed by approximately 3%.

Figure 11:
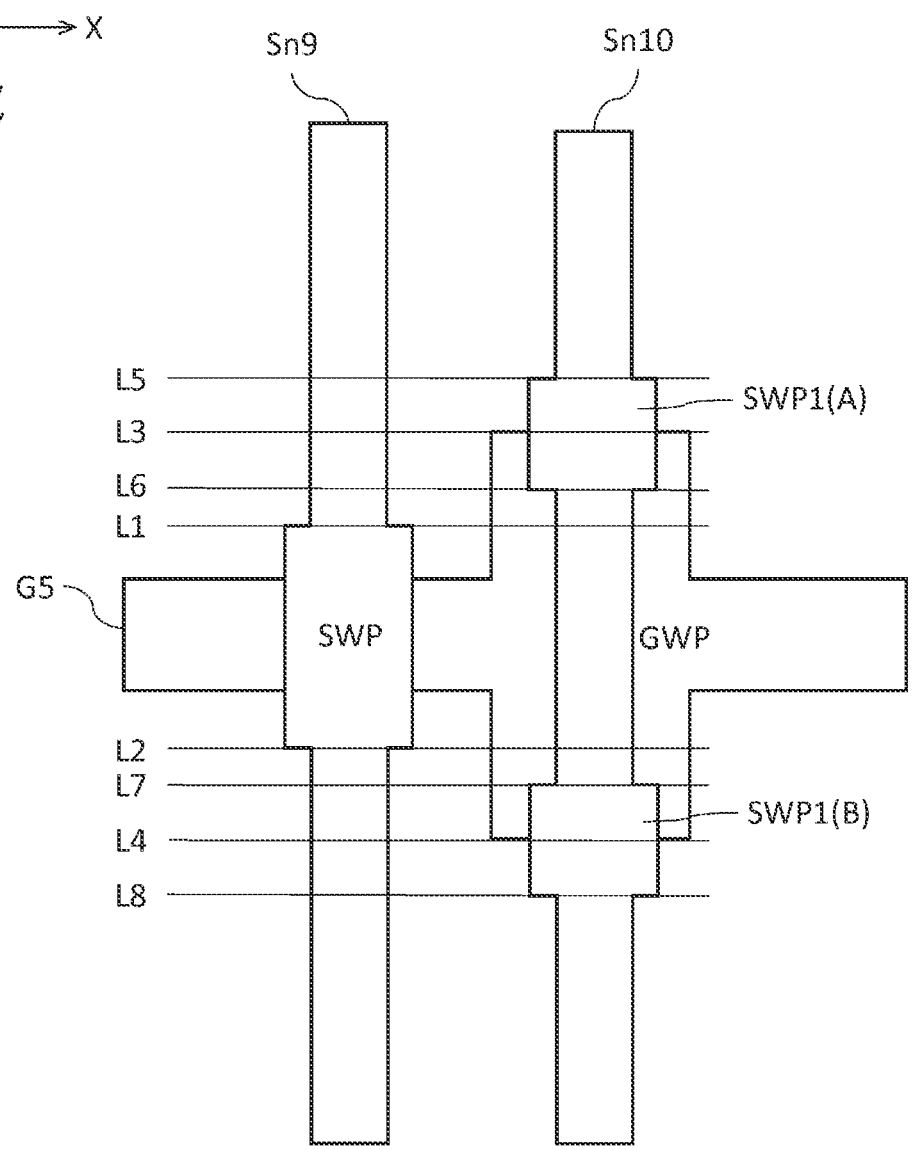
FIG. 11 is a plan view explaining the intersecting portion of the scan line and the signal line in FIG. 10.

FIG. 11 is a plan view explaining the intersecting portion of the scan line and the signal line in FIG. 10. In the following description, the relationship between the signal lines Sn9 and Sn10 will be illustratively described. In the following description, in the relationship between the signal lines Sn10 and Sn11, the left side is changed to the right side, and the right side is changed to the left side.

In FIG. 11, a line L1 denotes the position of the upper side (first side) of the wide section SWP in the second direction Y. A line L2 denotes the position of the lower side (second side) of the wide section SWP in the second direction Y. The lower side of the wide section SWP is the side opposite to the upper side of the wide section SWP.

A line L3 denotes the position of the upper side (first side) of the wide section GWP in the second direction Y. A line L4 denotes the position of the lower side (second side) of the wide section GWP in the second direction Y. The lower side of the wide section GWP is the side opposite to the upper side of the wide section GWP.

A line L5 denotes the position of the upper side (first side) of SWP1(A) that is one of the pair of wide sections SWP1 in the second direction Y. A line L6 denotes the position of the lower side (second side) of the SWP1(A) that is one of the pair of wide sections SWP1 in the second direction Y. The lower side of the SWP1(A) that is one of the pair of wide sections SWP1 is the side opposite to the upper side of the SWP1(A) that is one of the pair of wide sections SWP1.

A line L7 denotes the position of the upper side (first side) of SWP1(B) that is the other of the pair of wide sections SWP1 in the second direction Y. A line L8 denotes the position of the lower side (second side) of the SWP1(B) that is the other of the pair of wide sections SWP1 in the second direction Y. The lower side of the SWP1(B) that is the other of the pair of wide sections SWP1 is the side opposite to the upper side of the SWP1(B) that is the other of the pair of wide sections SWP1.

The wide section SWP intersects the scan line G5 between the upper side and the lower side thereof (or between the line L1 and the line L2).

The upper side of the wide section GWP (corresponding to the line L3) is located between the upper side and the lower side of the SWP1(A) that is one of the pair of wide sections SWP1 (or between the line L5 and the line L6). The SWP1(A) that is one of the pair of wide sections SWP1 intersects the upper side of the wide section GWP (corresponding to the line L3) between the upper side and the lower side the SWP1(A) (or between the line L5 and the line L6).

The lower side of the wide section GWP (corresponding to the line L4) is located between the upper side and the lower side of the SWP1(B) that is the other of the pair of wide sections SWP1 (or between the line L7 and the line L8). The SWP1(B) that is the other of the pair of wide sections SWP1 intersects the lower side of the wide section GWP (corresponding to the line L4) between the upper side and the lower side of the SWP1(B) (or between the line L7 and the line L8).

The upper side and the lower side of the wide section SWP (the line L1 and the line L2) are located between the lower side (line L6) of the SWP1(A) that is one of the pair of wide sections SWP1 and the upper side (line L7) of the SWP1(B) that is the other of the pair of wide sections SWP1. Therefore, the right side provided between the upper side and the lower side of the wide section SWP is opposite to the left side of the signal line Sn10 between the SWP1(A) that is one of the pair of wide sections SWP1 and the SWP1(B) that is the other of the pair of wide sections SWP1. The left side provided between the upper side and the lower side of the SWP1(A) that is one of the pair of wide sections SWP1 and the left side provided between the upper side and the lower side of the SWP1(B) that is the other of the pair of wide sections SWP1 are opposite to the right side of the signal line Sn9 except for the wide section SWP.

Figure 12:
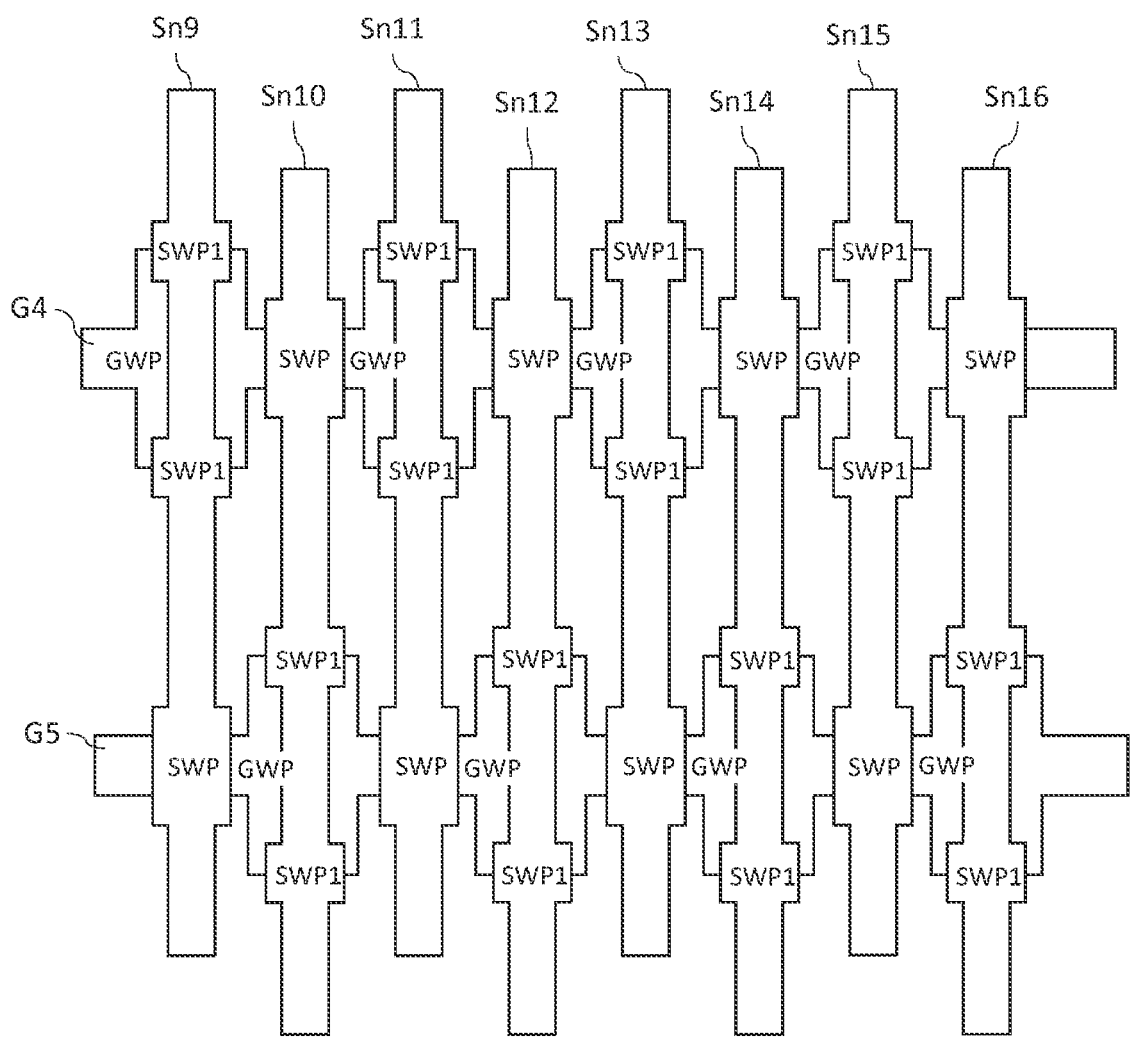
FIG. 12 is a plan view illustrating another configuration example of the intersecting portion of the scan line and the signal line according to an embodiment.

FIG. 12 is a plan view illustrating another configuration example of the intersecting portion of the scan line and the signal line according to an embodiment. In FIG. 10, the configuration of the intersecting portion of the scan line G5 and each of the signal lines Sn9 to Sn16 has been described. In FIG. 12, the configuration of the intersecting portion of each of two adjacent scan lines (G4, G5) extended in the first direction X and each of the signal lines Sn9 to Sn16 extended in the second direction Y will be described. The point of FIG. 12 different from FIG. 10 will be mainly described below.

In FIG. 12, the point of FIG. 12 different from FIG. 10 is that the intersecting portion of the scan line G4 and each of the signal lines Sn9 to Sn16 is drawn. The configuration of the intersecting portion of the scan line G5 and each of the signal lines Sn9 to Sn16 is the same as FIG. 10, and the description thereof is omitted.

In the scan line G4, the scan line G4 has a plurality of wide sections GWP, and the scan line G4 and the signal lines Sn9, Sn11, Sn13, and Sn15 intersect each other at the plurality of wide sections GWP.

Each of the signal lines Sn10, Sn12, Sn14, and Sn16 has the wide section SWP at the portion intersecting the scan line G4.

Each of the signal lines Sn9, Sn11, Sn13, and Sn15 has the pair of wide sections SWP1, and intersects the wide section GWP of the scan line G4 at the pair of wide sections SWP1. One of the pair of wide sections SWP1 is disposed corresponding to the upper side portion of the wide section GWP. The other of the pair of wide sections SWP1 is disposed corresponding to the lower side portion of the wide section GWP. That is, by providing the wide section GWP in the scan line G4, the wide section SWP and the pair of wide sections SWP1 are disposed so that the wide section SWP and the pair of wide sections SWP1 are not opposite to each other between the adjacent signal lines.

That is, each of the signal lines Sn9, Sn11, Sn13, and Sn15 has the pair of wide sections SWP1 at the portions intersecting the scan line G4, and has the wide section SWP at the portion intersecting the scan line G5. Each of the signal lines Sn10, Sn12, Sn14, and Sn16 has the wide section SWP at the portion intersecting the scan line G4, and has the pair of wide sections SWP1 at the portions intersecting the scan line G5.

According to this configuration, the wide section GWP of the scan line G4 and the wide section GWP of the scan line G5 are disposed so that they are not overlapped with each other, so that the scan line 4, the scan line G5, and the wiring pitch can also be narrowed.

Figure 13:
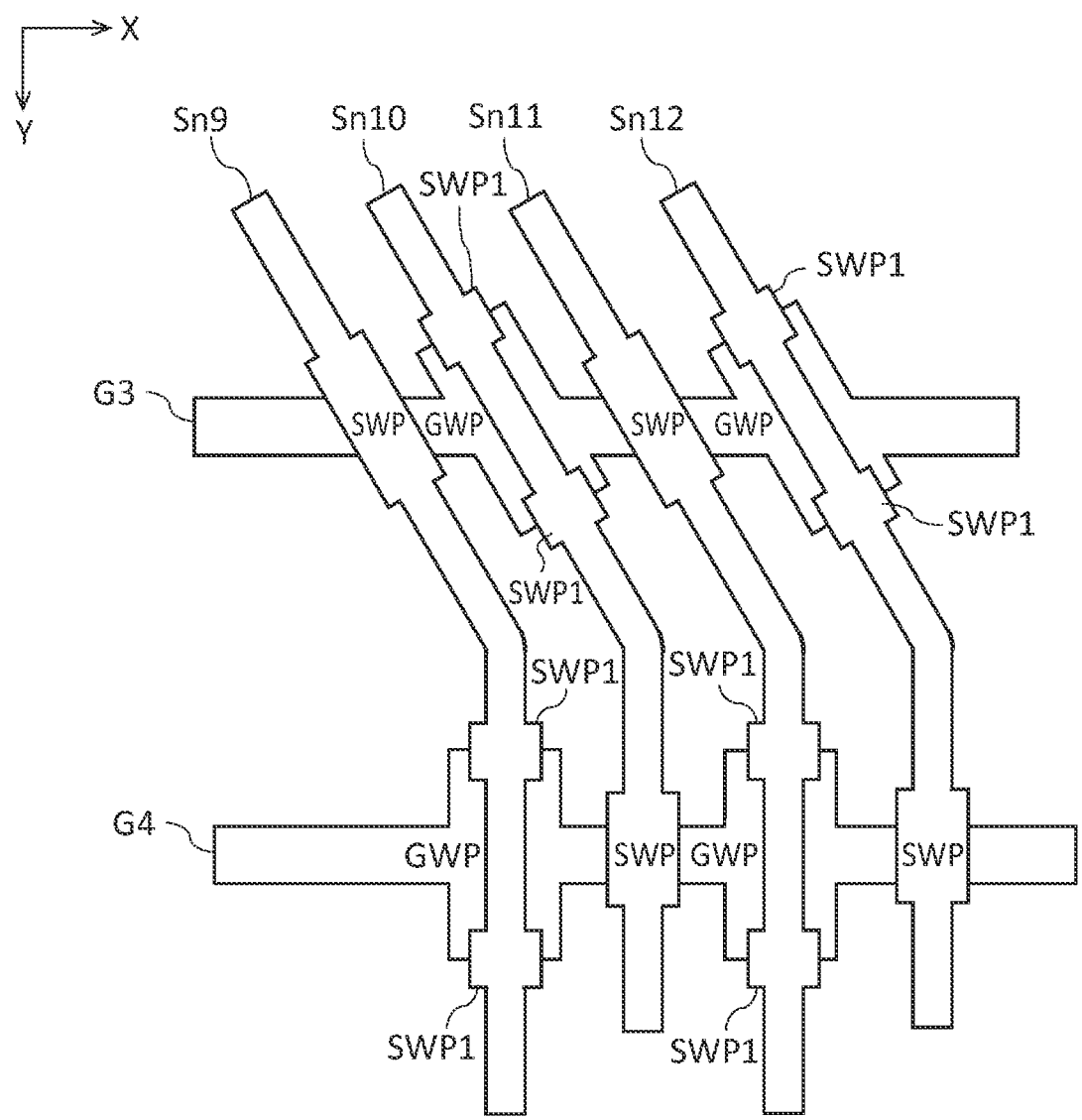
FIG. 13 is a plan view illustrating a further configuration example of the intersecting portion of the scan line and the signal line according to an embodiment.

FIG. 13 is a plan view illustrating a further configuration example of the intersecting portion of the scan line and the signal line according to an embodiment. In FIG. 12, the configuration of the intersecting portion of each of the two adjacent scan lines (G4, G5) and each of the signal lines Sn9 to Sn16 has been described. As illustrated in FIG. 8, the scan line G3 is extended in the first direction X, the signal lines Sn9 to Sn16 are extended so as to be inclined from the second direction Y, and the signal lines Sn9 to Sn16 obliquely intersect the scan line G3. In FIG. 13, the configuration of the intersecting portion of the scan line G3 extended in the first direction X and each of the signal lines Sn9 to Sn12 extended so as to be inclined from the second direction Y will be illustratively described. This is ditto for the signal lines Sn13 to Sn16, not illustrated.

In FIG. 13, like the signal lines Sn9 to Sn12 extended so as to be inclined from the second direction Y, the plurality of wide sections GWP provided in the scan line G3 are extended so as to be inclined from the second direction Y. The wide section SWP provided in each of the signal lines Sn9 and Sn11 extended so as to be inclined from the second direction Y is also extended so as to be inclined from the second direction Y. Both ends of the wide section GWP of the scan line G3 are the sides in the direction perpendicular to each of the signal lines Sn9 to Sn12 extended so as to be inclined from the second direction Y. The pair of wide sections SWP1 provided in each of the signal lines Sn10 and Sn12 extended so as to be inclined from the second direction Y are provided at the both ends of the wide section GWP of the scan line G3.

According to this configuration, also in the intersecting portion of the scan line G3 extended in the first direction X and each of the signal lines Sn9 to Sn12 extended so as to be inclined from the second direction Y (the case where each of the signal lines Sn9 to Sn16 and the scan line G3 obliquely intersect each other), the wiring pitch of the signal lines Sn9 and Sn10, Sn10 and Sn11, or Sn11 and Sn12 extended so as to be inclined from the second direction Y can be narrowed. Therefore, the width LFRR of the frame region FRR can also be narrowed.

It should be noted that in the above embodiments, as illustrated in FIG. 7, the non-driving region NDR has been described to have the configuration including the first substrate SUB1, the liquid crystal layer LC, and the second substrate SUB2, but the present invention is not limited to this. In the non-driving region NDR, an opening may be provided in each of the first substrate SUB1 and the second substrate SUB2. In this case, the seal material for sealing the liquid crystal layer LC and the spacer for defining the interval between the first substrate SUB1 and the second substrate SUB2 are provided in the frame region FRR.

All the display devices that can be embodied by the appropriate design change by those skilled in the art based on the display device described above as the embodiments of the present invention also belong to the scope of the present invention as long as they encompass the purport of the present invention.

In the idea category of the present invention, those skilled in the art can conceive various change examples and modifications, and it is understood that those change examples and modifications also belong to the scope of the present invention. For example, the above respective embodiments that are subjected to component addition, deletion, or design change by those skilled in the art as appropriate, or that are subjected to step addition, omission, or condition change by those skilled in the art as appropriate are also encompassed in the scope of the present invention as long as they are provided with the purport of the present invention.

Also, it is understood that other operational advantages provided by the forms described in the embodiments that are apparent from the description of this specification or that can be conceived by those skilled in the art as appropriate are, of course, provided by the present invention.

Various inventions can be formed of the appropriate combinations of a plurality of components disclosed in the above embodiments. For example, some components may be deleted from all the components illustrated in the embodiments. Further, the components across the different embodiments may be combined as appropriate.

REFERENCE SIGNS LIST

DSP: display device
PNL: display panel
SUB1: first substrate
SUB2: second substrate
DA: displaying section (displaying region)
NDA: non-displaying section (non-displaying region)
SE: seal material
PX: pixel
NDR: non-driving region (transparent region)
FRR: frame region (wiring region)
G: scan line (gate wiring)
S: signal line (image signal wiring)
BM, BML: light shield layer

What is claimed is:

1. A display device comprising a display panel having a displaying section,
wherein the displaying section includes:
a first region having a plurality of pixels; and
a second region having a non-driving region and a frame region provided so as to surround an outer circumference of the non-driving region and having an outer circumference surrounded by the first region,
wherein the frame region includes:
a first scan line; and
a first signal line and a second signal line adjacent to each other,
wherein the first signal line has a first wide section, and the first signal line intersects the first scan line at the first wide section in plan view,
wherein the first scan line has a second wide section,
wherein the second signal line has a pair of third wide sections, and the second signal line intersects the second wide section of the first scan line at the pair of third wide sections in plan view, and
wherein the first wide section of the first signal line is opposite to the second signal line between the pair of third wide sections without being opposite to the pair of third wide sections.

2. The display device according to claim 1,
wherein the first region includes a first light shield layer in a grid shape,
wherein the frame region includes a second light shield layer in a plate shape, and
wherein in plan view, a width of the second light shield layer is larger than vertical and lateral line widths forming the grid shape of the first light shield layer.

3. The display device according to claim 1,
wherein the first region includes a plurality of scan lines and a plurality of signal lines,
wherein the first scan line is one of the plurality of scan lines, and
wherein the first signal line and the second signal line are two of the plurality of signal lines.

4. The display device according to claim 1, wherein the non-driving region is a transparent region that is optically transparent.

5. The display device according to claim 4, wherein as compared with the non-driving region, the first region further has a semiconductor layer, the scan line, the signal line, a metal wiring, a coloring layer, and the light shield layer in the grid shape.

6. The display device according to claim 1,
wherein the frame region further includes a second scan line,
wherein the second signal line has a fourth wide section, and the second signal line intersects the second scan line at the fourth wide section in plan view,
wherein the second scan line has a fifth wide section, wherein the first signal line has a pair of sixth wide sections, and the first signal line intersects the fifth wide section of the second scan line at the pair of sixth wide sections in plan view, and wherein the fourth wide section of the second signal line is opposite to the first signal line between the pair of sixth wide sections without being opposite to the pair of sixth wide sections.

7. The display device according to claim 6, wherein the first scan line is extended along a first direction, wherein the first signal line and the second signal line intersect the first scan line along a second direction, wherein the second scan line is extended along the first direction, and wherein the first signal line and the second signal line obliquely intersect the second scan line so as to be inclined from the second direction.

\* \* \* \* \*